United States Patent
Reynolds et al.

(10) Patent No.: US 6,658,547 B1
(45) Date of Patent: Dec. 2, 2003

(54) METHOD AND APPARATUS FOR SPECIFYING ADDRESS OFFSETS AND ALIGNMENT IN LOGIC DESIGN

(75) Inventors: Bart Reynolds, Seattle, WA (US); Sridhar Krishnamurthy, San Jose, CA (US); Damon McCormick, Mountain View, CA (US); Kai Zhu, Palo Alto, CA (US)

(73) Assignee: Triscend Corporation, Mountain View, CA (US)

( * ) Notice: Subject to any disclaimer, the term of this patent is extended or adjusted under 35 U.S.C. 154(b) by 355 days.

(21) Appl. No.: 09/645,865

(22) Filed: Aug. 23, 2000

(51) Int. Cl.[7] .............................................. G06F 12/00
(52) U.S. Cl. ....................... 711/201; 711/202; 711/210; 711/212; 711/220
(58) Field of Search ................ 711/202, 212, 711/220, 203, 206, 207, 210, 201, 1

(56) References Cited

U.S. PATENT DOCUMENTS

| | | | | |
|---|---|---|---|---|
| 4,947,366 A | * | 8/1990 | Johnson .......................... | 710/3 |
| 5,666,508 A | * | 9/1997 | Marshall, Jr. ................. | 711/201 |
| 5,835,926 A | * | 11/1998 | Pesuit ............................ | 711/1 |
| 6,026,239 A | * | 2/2000 | Patrick et al. ............... | 717/154 |
| 6,449,706 B1 | * | 9/2002 | Chen et al. ................... | 711/201 |
| 6,457,115 B1 | * | 9/2002 | McGrath ....................... | 711/220 |

FOREIGN PATENT DOCUMENTS

WO    W/O 00/22546    4/2000

\* cited by examiner

*Primary Examiner*—Donald Sparks
*Assistant Examiner*—Brian R. Peugh
(74) *Attorney, Agent, or Firm*—Blakely, Sokoloff, Taylor & Zafman LLP

(57) ABSTRACT

A method for asserting an address alignment of an address for a memory-mapped device in a logic design is disclosed. An align primitive comprising an alignment size port, an input address port and an output address port is used. The alignment size port has data indicating a desired address boundary. The input address port is used for an address to be verified against the desired address boundary. The output address port is used to provide an address that is on the desired address boundary. The address to be verified against the desired address boundary is provided at the output address port when that address meets the desired address boundary.

Another method for specifying an offset address for a memory-mapped device in a logic design is disclosed. An offset primitive is used to assert an address for the memory-mapped device. The offset primitive comprises an incoming address port, an outgoing address port and an offset value port. The offset value port has a data value indicating a desired address offset. The incoming address port has a base address to calculate an offset address. The outgoing address port has the offset address. The offset value is a multiple of a transaction size at the memory-mapped device.

38 Claims, 12 Drawing Sheets

METHOD AND APPARATUS FOR SPECIFYING ADDRESS OFFSETS AND ALIGNMENT IN LOGIC DESIGN

FIELD OF THE INVENTION

The present invention relates generally to the field of logic design. More specifically, the present invention is directed to a method and an apparatus for specifying address offsets and alignment for memory-mapped device.

BACKGROUND

Logic designers use hardware description language (HDL) or schematic capture to model a circuit at different level of abstractions. The circuit model is synthesized to construct a gate-level netlist.

Traditional electronic design automation tool flows require the logic designer to specify fixed addresses for each component in the system. To the extent that a component has internal addressing requirements, such as a set of contiguous registers, or address alignment requirements, the logic designer has been required to explicitly specify the addressability of each component of the device such that it meets those offset and alignment requirements. However, this requirement may be difficult for the logic designer when address relationships become complicated.

SUMMARY OF THE INVENTION

In one embodiment, a method for asserting an address alignment of an address for a memory-mapped device in a logic design is disclosed. An align primitive comprising an alignment size port, an input address port and an output address port is used. The alignment size port has data indicating a desired address boundary. The input address port is used for an address to be verified against the desired address boundary. The output address port is used to provide an address that is on the desired address boundary. The address to be verified against the desired address boundary is provided at the output address port when that address meets the desired address boundary.

Other features and advantages of the present invention will be apparent from the accompanying drawings and from the detailed description which follows.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

In one embodiment, a method for specifying relative address offsets between memory-mapped devices in a logic design is disclosed. In another embodiment, a method for constraining address alignment of addresses for the memory-mapped devices is disclosed. In another embodiment, a method for specifying relative-address offsets between memory-mapped devices and constraining address alignment of addresses for those devices is disclosed.

Figure 1:
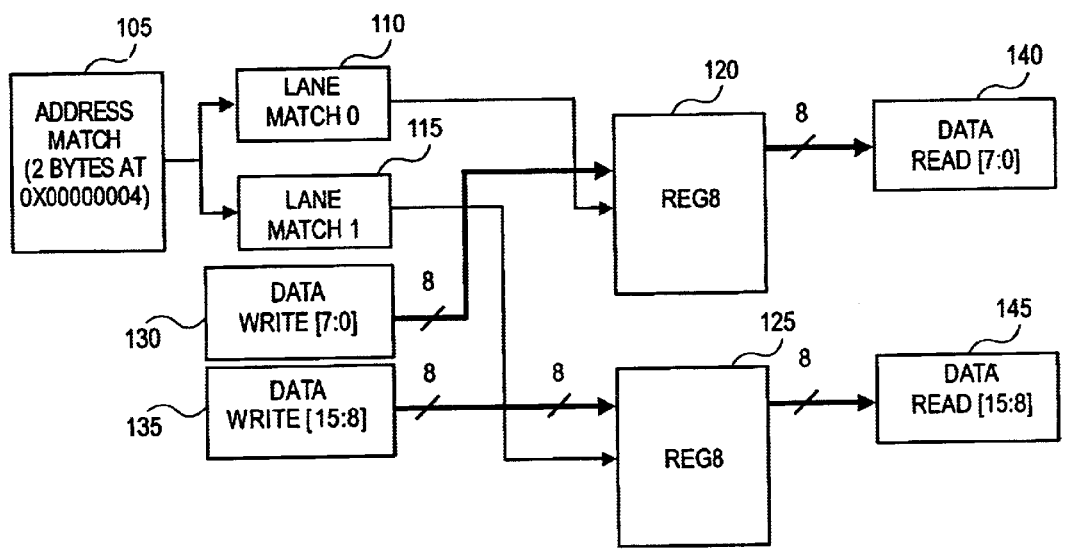
FIG. 1 is an exemplary logic diagram showing explicit addressability and bus connections.

FIG. 1 is an exemplary logic diagram showing explicit address-matching functions, lane matching functions and data bus connections. FIG. 1 shows a memory mapped 2-byte device (e.g., register) with individually addressable bytes 120, 125. Other signals not shown in FIG. 1 may include, for example, addresses, data, clock, wait, read, write, etc. Address-matching function 105 is typically specified as a set of logic gates (in schematic capture) or a logic equation (in hardware description language ("HDL")) that is synthesized to a set of gates. The address-matching function 105 determines the addresses the memory-mapped device is mapped to. The address-matching function 105 also performs address-decoding function. At design time, a constant address is specified. At run time, during operation of the logic, the address decoding function compares the constant against the addresses seen on the bus to see if there is a match.

The lane-matching function which includes Lane Match 0 110 and Lane Match 1 115, is also specified as a set of logic gates (in schematic capture) or a logic equation (in HDL) that is synthesized to a set of gates. The lane-matching function suppresses the address-matching function for certain bus transaction sizes and alignments. For example, for the 2-byte register with the individually addressable bytes shown in FIG. 1, there may be a single address-matching function 105 with a distinct lane-matching function for each byte. The Lane Match 0 lane-matching function 110 would match all transactions (e.g., read, write) that include the first byte. The Lane Match 1 lane-matching function 115 would match all transactions that include the second byte. The logic diagram of FIG. 1 would require the logic designer to explicitly specify connections to system bus data bits. The first byte 120 of the 2-byte register would connect to a set of eight different system bus data bits (0 to 7) 130. Similarly, the second byte 125 of the 2-byte register would connect to another set of eight different system bus data bits (8 to 15) 135.

For example, in a 2-byte transaction to the register at address 0x00000004, when there is a match, the Lane Match 0 lane-matching function 110 would match the first byte address 0x00000004. The Lane Match 1 lane-matching function 115 would match the second byte address 0x00000005. The address 0x00000004 refers to the first byte 120 of the register, and the address 0x00000005 refers to the second byte 125 of the register. When there is a write transaction, the first data byte 130 is written into the first byte of the register 120 and the second data byte 135 is written into the second byte of the register 125. When there is a read transaction, the first data byte 140 and the second data byte 145 from the register is provided to the respective bits of the data bus.

The address 0x00000004 in this example is a constant specified at design time. When there is a need to make any changes to the design of the memory-mapped device, such as, for example, the address constant, the logic designer has to make the change to the lane matching and the related connections. For example, for a 32-bit data bus, when the logic designer wants to change the address from 0x00000004 to 0x00000006, this requires the lane matching function to match the first byte to Lane Match 2 (not shown) and the second byte to Lane Match 3 (not shown). The corresponding data bytes would be from bits 15–23 for the first data byte and bits 24–31 for the second data byte (i.e., the second half of the word). This would require having to change and recompile the HDL source and schematic.

In one embodiment, the method of the present invention allows the logic designer to specify addresses for an addressable entity without having to be involved in the detailed requirement of address matching and lane matching. The logic designer uses a set of logic design components, referred to herein as "data access primitives", to specify an assembly of address and lane-matching logic and associated data bus connections. The data access primitive hides the details of interconnection to the bus, and abstracts away the interdependency of address-matching functions, lane-matching functions, and data bus connections.

Figure 2:
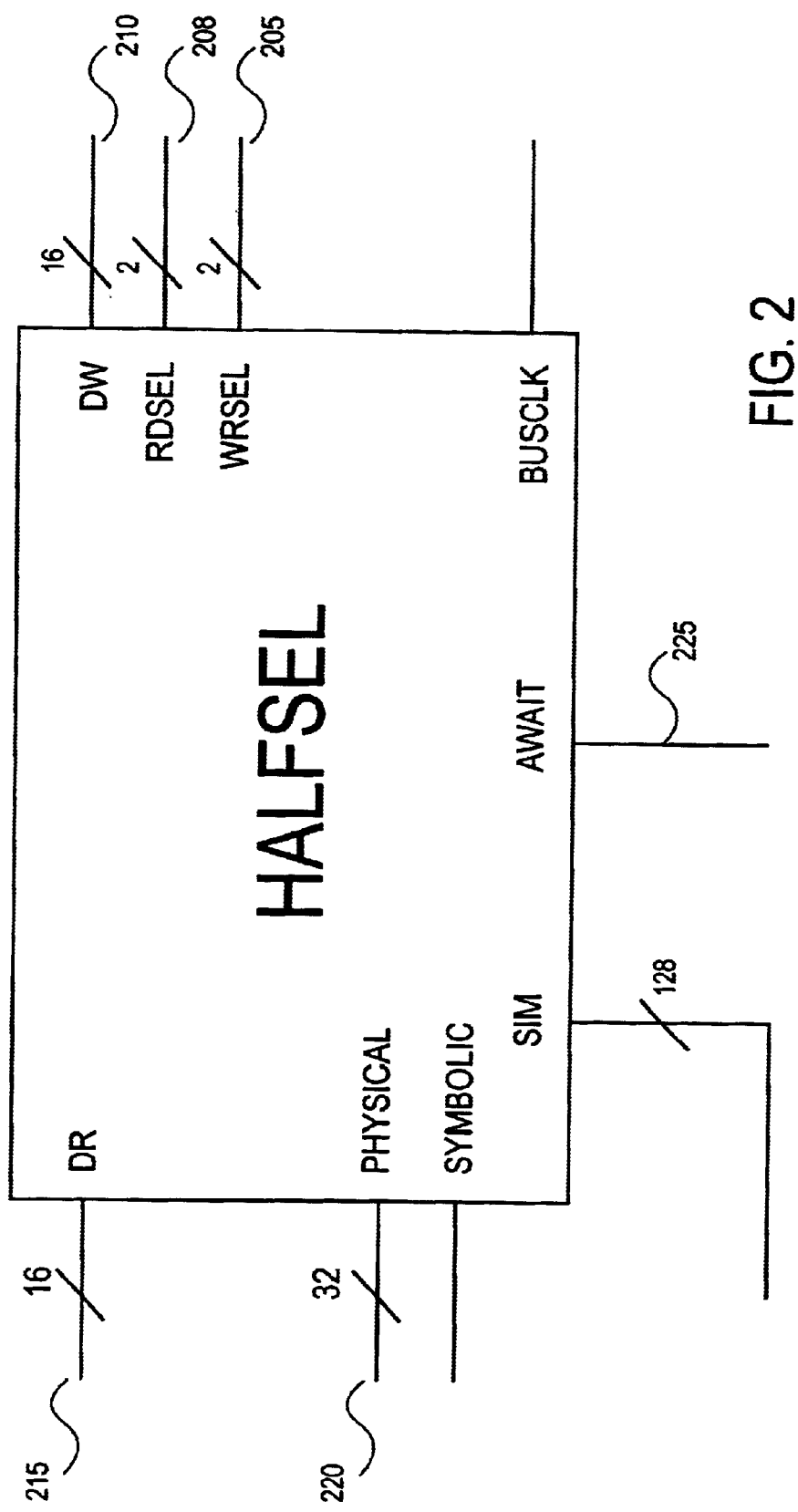
FIG. 2 is an exemplary diagram of a halfword selector data access primitive.

FIG. 2 is an exemplary diagram of a halfword selector data access primitive. Each data access primitive implies an address-matching function, one or more lane-matching functions, and bus connections for one or more bytes of data, as well as auxiliary logic. The data access primitive in FIG. 2 is referred to herein as "HALFSEL" data access primitive. The HALFSEL data access primitive is a fully addressable data access primitive because it can be used to connect a byte-, a halfword-, or a word-addressable 2-byte entity to the data bus.

The write-select (WRSEL) port 205 has two lines, one for each byte of the halfword. During a halfword or word write transaction, both lines of the WRSEL port 205 go high when there is an address match. During a byte write transaction, at most one of the lines of the WRSEL port 205 goes high when there is an address match. Similarly, the read-select (RDSEL) port 208 has two lines and goes active during a read transaction when the addresses and lanes match. The HALFSEL data access primitive includes a data write port (DW) 210 and a data read port (DR) 215. The data read port provides data from the device to the bus. The data write port receives data from the bus. For read-only data, the WRSEL port 205 and the DW port 210 are not connected. For write-only data, the DR port 215 is tied low.

The physical port 220 has the address constant indicating the starting address of the memory-mapped device. The autowait (AWAIT) port 225 is a constant flag. When the AWAIT flag is high, one wait state is automatically generated to indicate to a device reading this address that it is going to take an additional bus clock cycle to get the data out of the memory mapped device. When the flag is low, there is no wait state. In another embodiment, the AWAIT port 225 can be configured to be multiple bits wide to enable encoding of additional wait states. One skilled in the art would recognize that other wait states beyond those asserted by the data access primitive may be asserted by other logic in the design, depending on the needs of the design.

Figure 3:
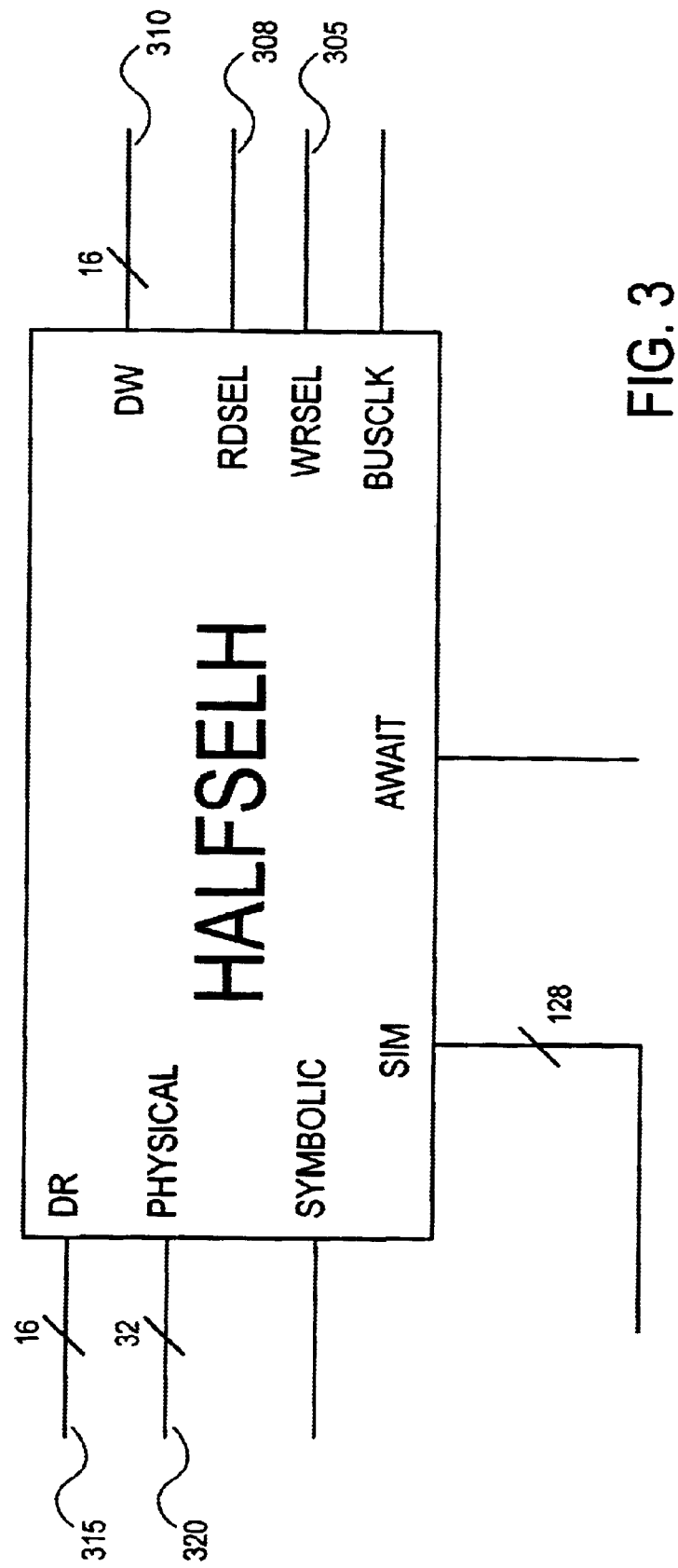
FIG. 3 is an exemplary diagram of another halfword selector data access primitive.

FIG. 3 is an exemplary diagram of another halfword selector data access primitive. The data access primitive in FIG. 3 is referred to herein as "HALFSELH" data access primitive. The HALFSELH data access primitive is a restricted data access primitive because it can be used to connect a halfword-, or a word-addressable half-word entity to the data bus. The HALFSELH can not be used to address a byte of the half-word entity, which is different from the fully addressable HALFSEL data access primitive. The write-select (WRSEL) port 305 has one line which is shared by both bytes of the halfword. During a halfword or word write transaction, the line goes high when there is an address match. The read-select (RDSEL) port 308 has one line and goes high during a read transaction when the address matches. The HALFSELH data access primitive includes a data write port (DW) 310 and a data read port (DR) 315.

Figure 4:
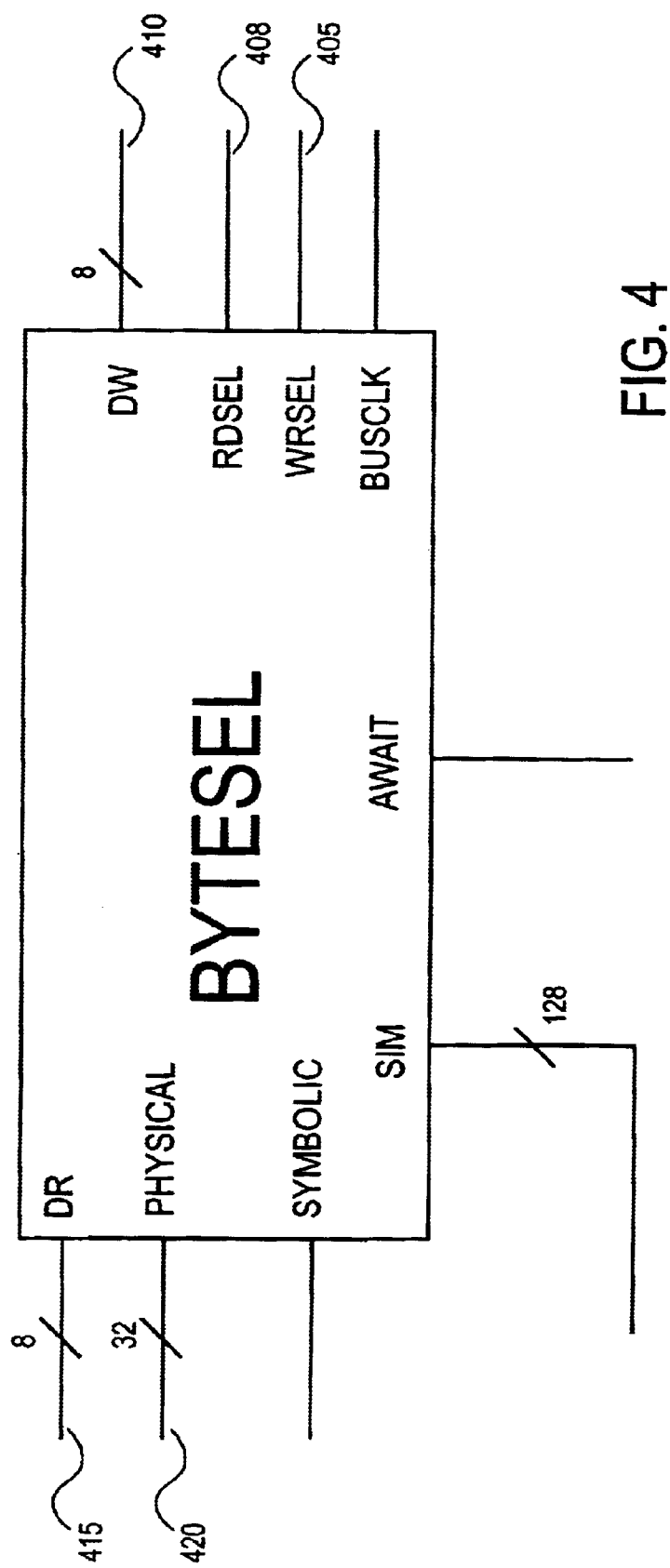
FIG. 4 is an exemplary diagram of a byte selector data access primitive.

FIG. 4 is an exemplary diagram of byte selector data access primitive. The data access primitive in FIG. 4 is referred to herein as "BYTESEL" data access primitive. The BYTESEL data access primitive is a fully addressable data access primitive because it can be used to connect a one-byte entity to the data bus. The BYTESEL data access primitive is very similar to the HALFSEL data access primitive, except that the write-select (WRSEL) port 405 and the read-select (RDSEL) 408 each has one line (bit) instead of two lines. The BYTESEL data access primitive also differs from the HALFSEL data access primitive in that it matches only a single byte rather than two bytes.

The data access primitives do not instantiate the logic (e.g., registers or RAMs) that stores the data being accessed. The data access primitives provide the addressability and data bus connections for the logic. Using the data access primitive such as, for example, the HALFSEL or the HALFSELH, the logic designer does not have to be involved with the complication of lane matching or addressability at design time or at subsequent changes. One skilled in the art will recognize that other data access primitives such as, for example, WORDSEL and WORDSELW, can also be implemented using the descriptions described above.

Although a data access primitive may require the logic designer to specify an explicit starting address for the physical port, the logic designer may leave the starting address of a data access primitive unspecified. The logic designer may choose to allow the starting address to be automatically assigned by an address allocator. The logic designer may choose to specify or restrict the starting addresses to be assigned to data access primitives using one or more address constraints. For example, the address constraints may be a block of addresses to be excluded or a specific starting address. In one embodiment, the address allocator is a software program that ensures that all of the data access primitives have fully specified addressability information. The address allocator reconciles the addressability specified in the logic design with the address constraints specified by the logic designer.

In one embodiment, a mapper program, referred to herein as a data access technology mapper, converts the data access primitives into low-level logic components necessary to implement the address-matching function, lane-matching function, bus connections, and auxiliary logic described above in FIG. 1. The data access technology mapper replaces the data access primitives with low-level logic components whose type and interconnection depend on both the type of the data access primitive and the starting address.

The starting address may be either allocated by the address allocator or specified by the user. The data access technology mapper uses the starting address and decides how the lane matching should be done among the components and which data should be read from the register. The exact mapping from data access primitives to low-level logic components depends on the implementation technology targeted by the data access technology mapper. For example, in the case of a Configurable System-on-Chip (CSoC), the data access technology mapper converts each data access primitives into one or more address selectors and multiple socket primitives for connecting to the system bus signals.

In one embodiment, the data access technology mapper combines the addressability implied by the data access primitives and the output of the address allocator program. By incorporating a data access primitive into a design, the logic designer can specify a complex assembly of address and lane-matching logic and associated data bus connections easily and without risk of specifying inconsistent information. At a later time, the logic designer can change the address for the data access primitive just by changing the address constraints. The logic designer does not have to change the logic design.

The data access primitives in the present invention are not implemented as a traditional logic macro. Although the data access primitive simplifies and abstracts the specification of logic design, the data access primitive is not a fixed composition of lower-level logic components. The data access technology mapper decides how to decompose the data access primitive, and that decomposition is dependent directly on the address assigned to the data access primitive. For example, depending on the address specified by the logic designer, the HALFSEL data access primitive may be converted by the data access technology mapper into different implementations.

Figure 5:
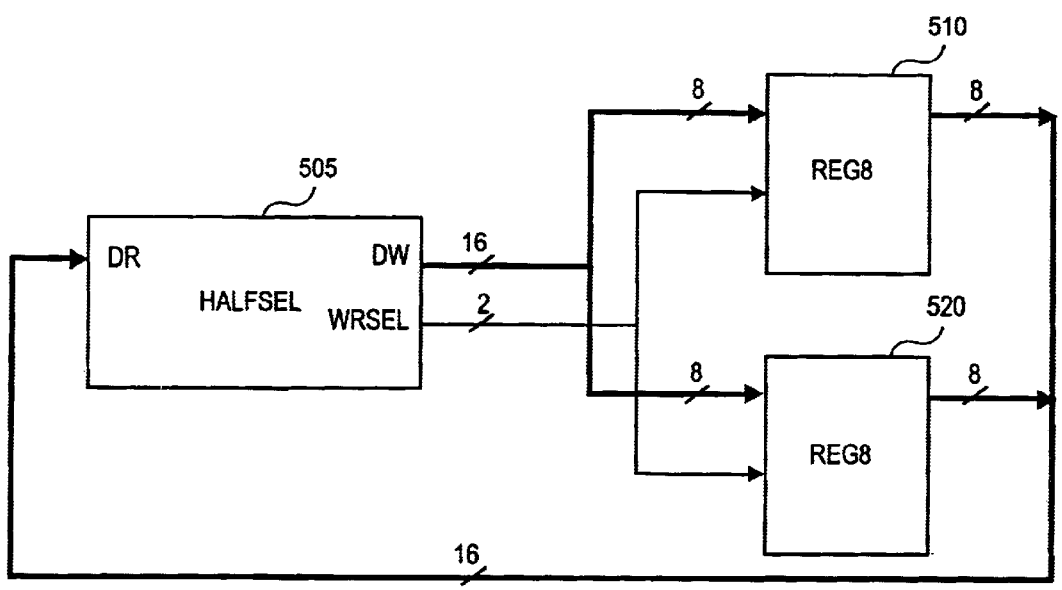
FIG. 5 is an exemplary logic diagram using a halfword selector data access primitive.

FIG. 5 is an exemplary logic diagram showing a HALFSEL data access primitive in an equivalent logic to that in FIG. 1. The HALFSEL data access primitive 505 includes the data read (DR) port, the data write (DW) port and the data write select (DWSEL) port. The DWSEL port has two lines. Although not shown, the HALFSEL 505 also include the ports shown in FIG. 2. The HALFSEL 505 is connected to a two-byte register with individually addressable bytes 510 and 520. Each of the two write-select lines of the HALFSEL data access primitive 505 is connected to the write-enable input of one of the 8-bit registers 510 and 520. Each of the two bytes of DW port of the HALFSEL data access primitive 505 is connected to the data input of one of the 8-bit registers 510 and 520. The data output of the register 510 and the register 520 are combined to form the two bytes of data input to the HALFSEL data access primitive 505 and is connected to the DR port.

Assume that the address allocator program assigns the address 0x00000004 to the HALFSEL data access primitive 505. The data access technology mapper program converts the HALFSEL data access primitive 505 into a single address-matching function and two lane-matching functions. The address-matching function matches either address 0x00000004 or 0x00000005(two bytes in the halfword). The first lane matching function matches only transactions that include the byte at 0x00000004. The second lane matching function matches only transactions that include the byte at 0x00000005. The data access technology mapper program also produces sixteen connections to the data-write (DW) port and sixteen connections to the data-read (DR) port. It also produces other auxiliary logic and connections. For example, in a 32-bit system bus, there are four transactions that pass the address matching function (i.e., matches):

1. A word-wide transaction at 0x00000004
2. A halfword-wide transaction at 0x000004
3. A byte-wide transaction at 0x00000004
4. A byte-wide transaction at 0x00000005.

The transactions 1, 2, and 3 match the first lane-matching function (transactions that contain 0x00000004). The transactions 1, 2, and 4 match the second lane-matching function (transactions that contain 0x00000005).

Figure 6:
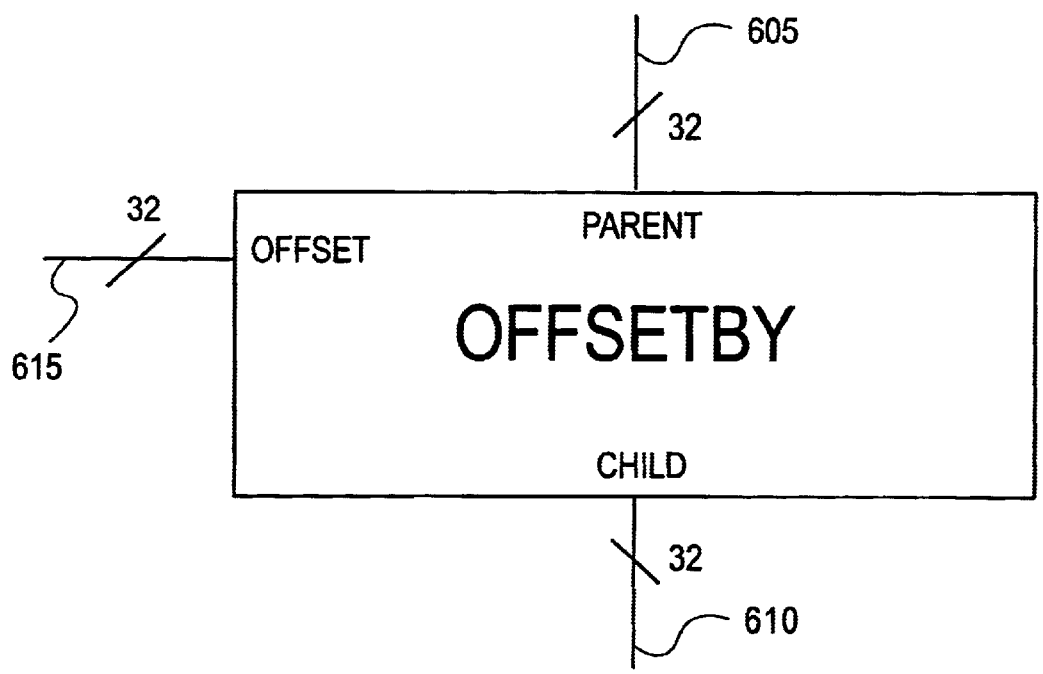
FIG. 6 is an exemplary diagram of an offsetby data access primitive.

FIG. 6 is an exemplary diagram of an offset primitive. The primitive in FIG. 6 is referred to herein as "OFFSETBY" primitive. In one embodiment, the OFFSETBY primitive subjects a data access primitive (e.g., BYTESEL, HALFSEL) to an address offset relative to a constant address or an automatically allocated address generated by the address allocator. The address offset relationship is described in terms of a parent and a child where an address for the child is an offset from an address for the parent. For example, the OFFSETBY primitive may be used to establish an address offset relationship between two HALFSEL data access primitives. The parent port 605 may be connected to the fixed or generated address, and the child port 615 may be connected to the physical port of the data access primitive. The offset port 615 is supplied with a constant value representing the address offset amount from the address presented at the parent port 605. The address offset amount should not be a negative value and should be a multiple of the transaction size. In one embodiment, multiple OFFSETBY primitives may be used in series by connecting the parent port of one OFFSETBY primitive to the child port of another OFFSETBY primitive. In this case, the address offset amount at a specific level is equal to the sum of the offset constants at the specific level and at the parent levels.

In the case when a constant address is specified by the logic designer, the offset address can be resolved. In the case when there is no constant address specified, the address presented at the child port 610 can not be resolved until address allocation time when an address is generated for the parent port 605. The OFFSETBY primitive does not instantiate logic. The OFFSETBY primitive can be simulated. During simulation of the OFFSETBY primitive, the address offset constant presented at the offset port 615 is added to the address presented at the parent port 605 and the result is an output at the child port 610. In one embodiment, the addition operates as unsigned 32-bit arithmetic (e.g., C=A+B) and any overflow is discarded.

Figure 7:
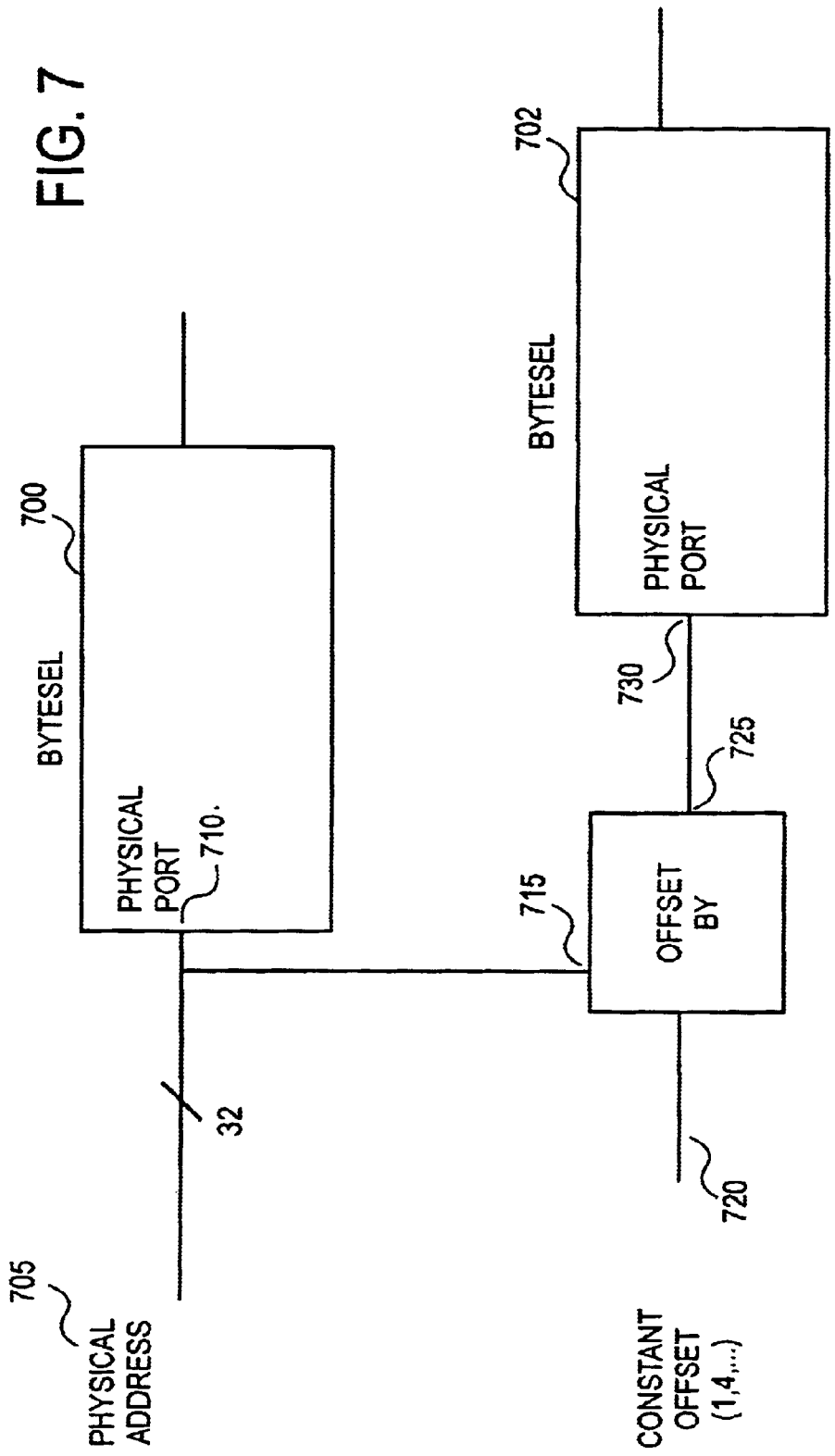
FIG. 7 is an exemplary logic diagram using an offsetby data access primitive.

FIG. 7 is an exemplary logic diagram showing an OFFSETBY primitive coupled with two BYTESEL data access primitives. The physical address 705 may be specified by the logic designer or it may be generated by the address allocator. The OFFSETBY primitive 715 subjects the address presented at the physical port 730 of the BYTESEL 702 to an offset from the address presented at the port 710 of the BYTESEL 700. The offset amount is indicated by the offset constant specified at port 720 of the OFFSETBY primitive 715. For example, when the physical address 705 is 0x00000004 and the constant offset 720 is 4, the address presented at the physical port 730 is 0x00000008.

Figure 8:
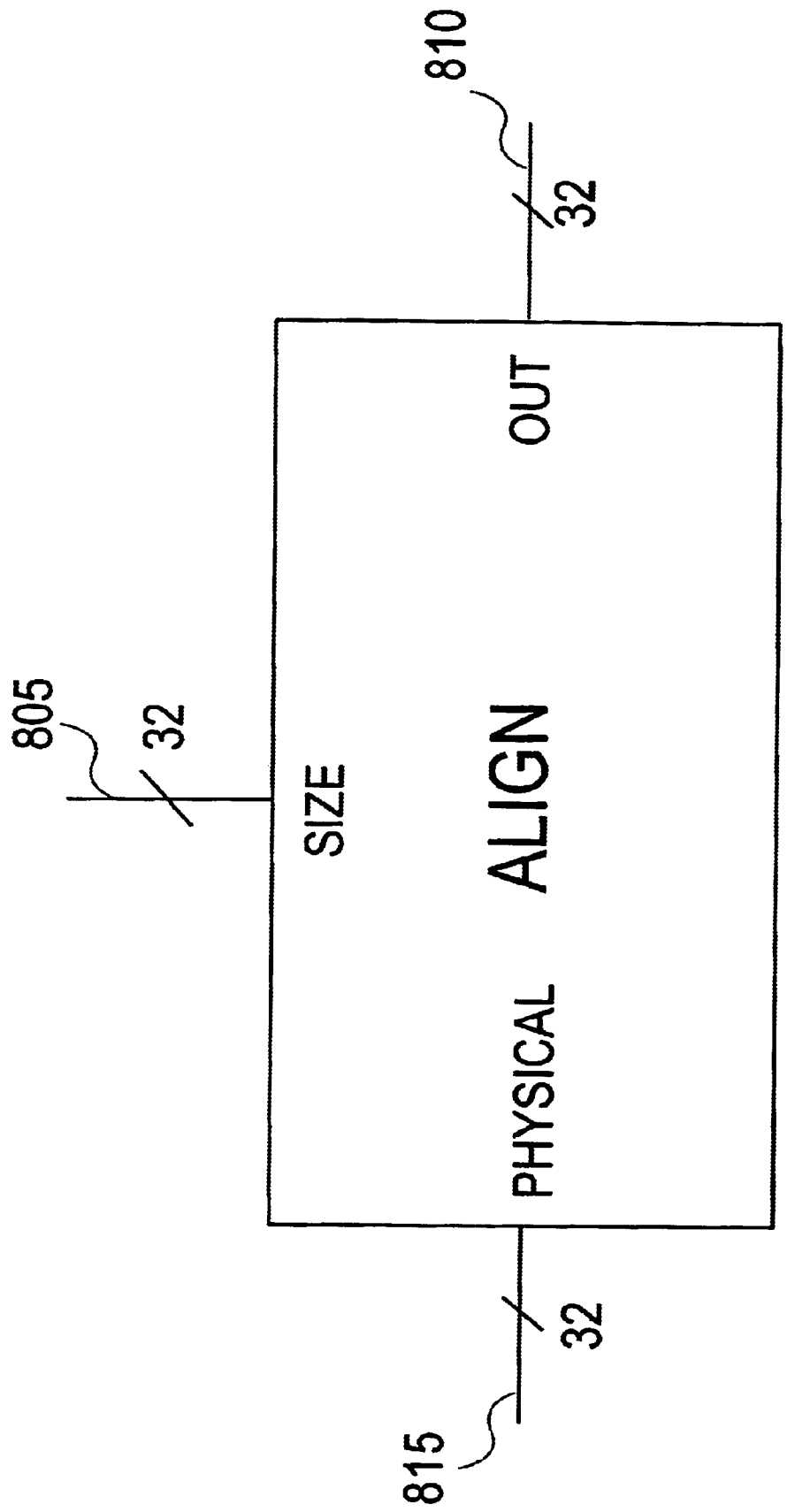
FIG. 8 is an exemplary diagram of an align data access primitive.

FIG. 8 is an exemplary diagram of an ALIGN primitive. The ALIGN primitive has a physical port 815 which carries an address value provided by the logic designer or the address allocator. A size port 805 has a data value which is a power of two and determines the address alignment for a data access primitive connected to an output port 810. For example, when the data value on the size port 805 is a 4, then the ALIGN primitive enforces that the address provided to the physical port 815 is to be on a four bytes boundary. When the address provided to the physical port 815 is not on a four bytes boundary, the address is rejected and can not be used for the data access primitive that the output port 810 is connected to.

The ALIGN primitive does not instantiate logic and it can be simulated. During simulation, the output value at the output port 810 is the same as the address value presented at physical port 815. In one embodiment, the address presented at the physical port 815 of a data access primitive (e.g., BYTESEL, HALFSEL) needs to be a multiple of the value of the data at the size port 805. When this is not the case, an address alignment violation occurs. The ALIGN primitive does not modify the address to coerce it to a particular address alignment.

Figure 9:
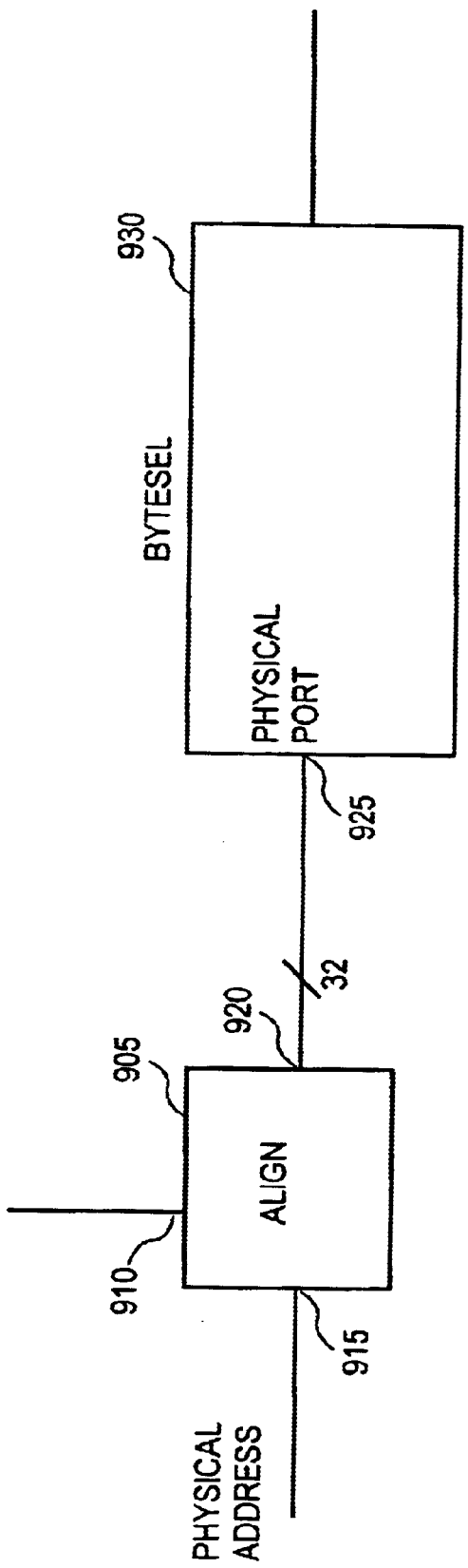
FIG. 9 is an exemplary logic diagram using an align data access primitive.

FIG. 9 is an exemplary logic diagram showing an ALIGN primitive coupled with a BYTESEL data access primitive. When the physical port 915 of the ALIGN primitive 905 is connected to the output of an address allocator, or when it is left unconnected, the value on the size port 910 constrains the address alignment of the address presented at the output port 920 of the ALIGN primitive 905. For example, when the address is chosen by the address allocator and the size port 910 has a value of 4, the address allocator uses the value at the size port 910 and assign an address that is in multiple of 4 to the output port 920. This address is then presented at the physical port 925 of the BYTESEL data access primitive 930.

In one embodiment, multiple ALIGN primitives may be used in series. In this case, each ALIGN primitive needs to have an alignment size that is not greater than any alignment size of the preceding ALIGN primitives. In addition, a data access primitive that is subject to an address alignment requirement due to an ALIGN primitive needs to have a data size no greater than the alignment size of the ALIGN primitive.

Figure 10:
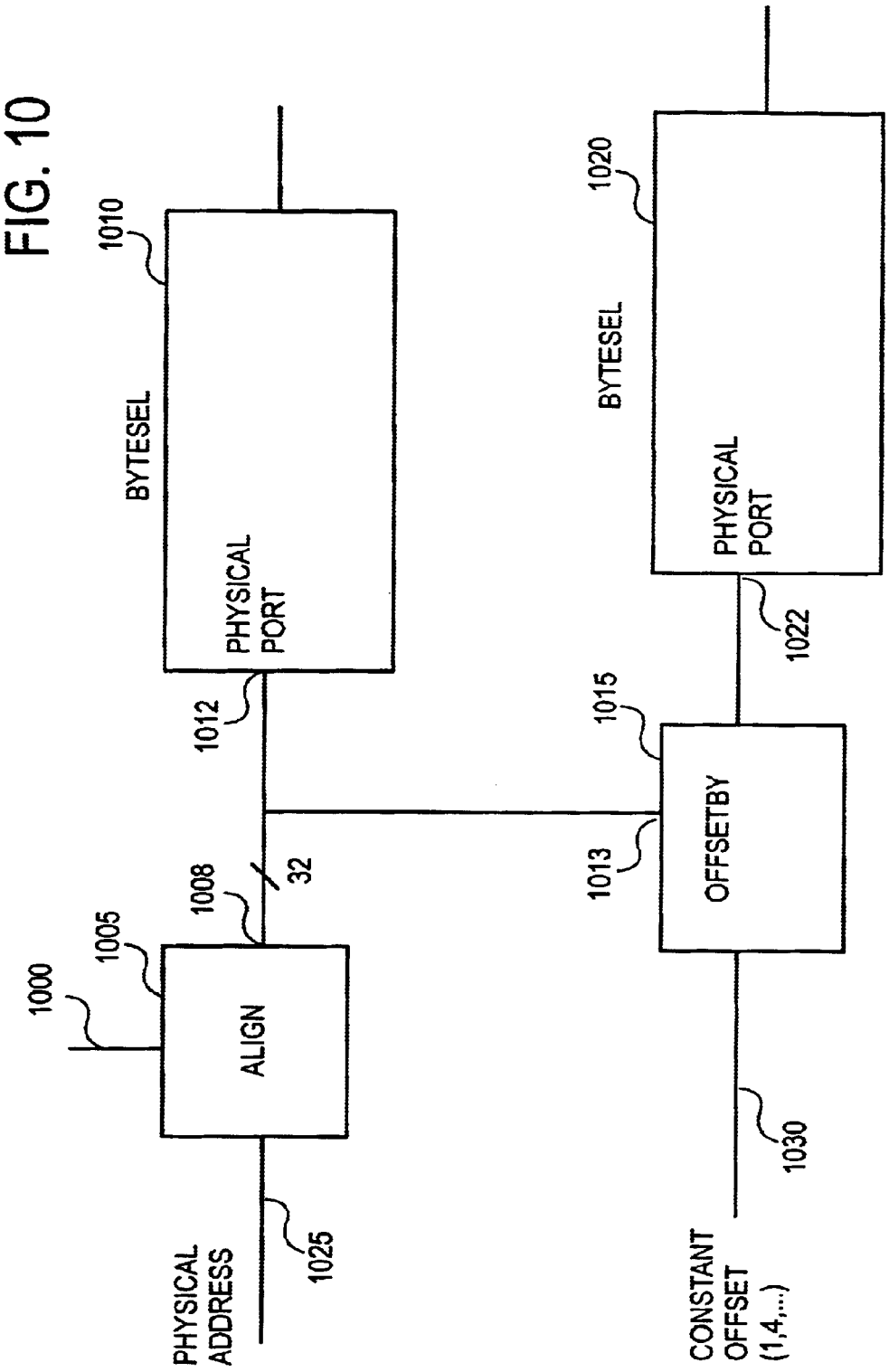
FIG. 10 is an exemplary logic diagram using an offsetby data access primitive and an align data access primitive.

FIG. 10 is an exemplary logic diagram illustrating an ALIGN primitive and an OFFSETBY primitive. In one embodiment, the OFFSETBY primitive and the ALIGN primitive can be used together to enforce address constraints on the data access primitives. For example, the diagram in FIG. 10 shows an ALIGN primitive 1005 followed by an OFFSETBY primitive 1015. The address at the output port 1008 of the ALIGN primitive 1005 is presented to the physical port 1012 of the BYTESEL data access primitive 1010. The same address is also presented to the parent port 1013 of the OFFSETBY primitive 1015. For example, when the align size port 1000 has a value of 16, then the address provided at the physical address port 1025 needs to be on a 16 byte boundary in order for that address to be presented at the output port 1008. This same 16 byte boundary address is presented to the physical port 1012 of the BYTESEL 1010 and to the parent port 1013 of the OFFSETBY primitive 1015. When the offset constant 1030 has a value of 4, then the address presented to the physical port of the BYTESEL 1020 is going to be on a 4 byte boundary since the address provided to the parent port 1013 is at the 16 byte boundary.

The ALIGN primitive may be subjected to a relative offset due to an OFFSETBY primitive. In this case, the child output of an OFFSETBY primitive is connected to the physical port of an ALIGN primitive. Furthermore, the offset value needs to be a multiple of the alignment size.

For purposes of determining the constant value on the physical port, the output of an OFFSETBY primitive or ALIGN primitive is also considered a constant, so long as the inputs of the OFFSETBY or another ALIGN primitive can be resolved to constants.

Figure 11:
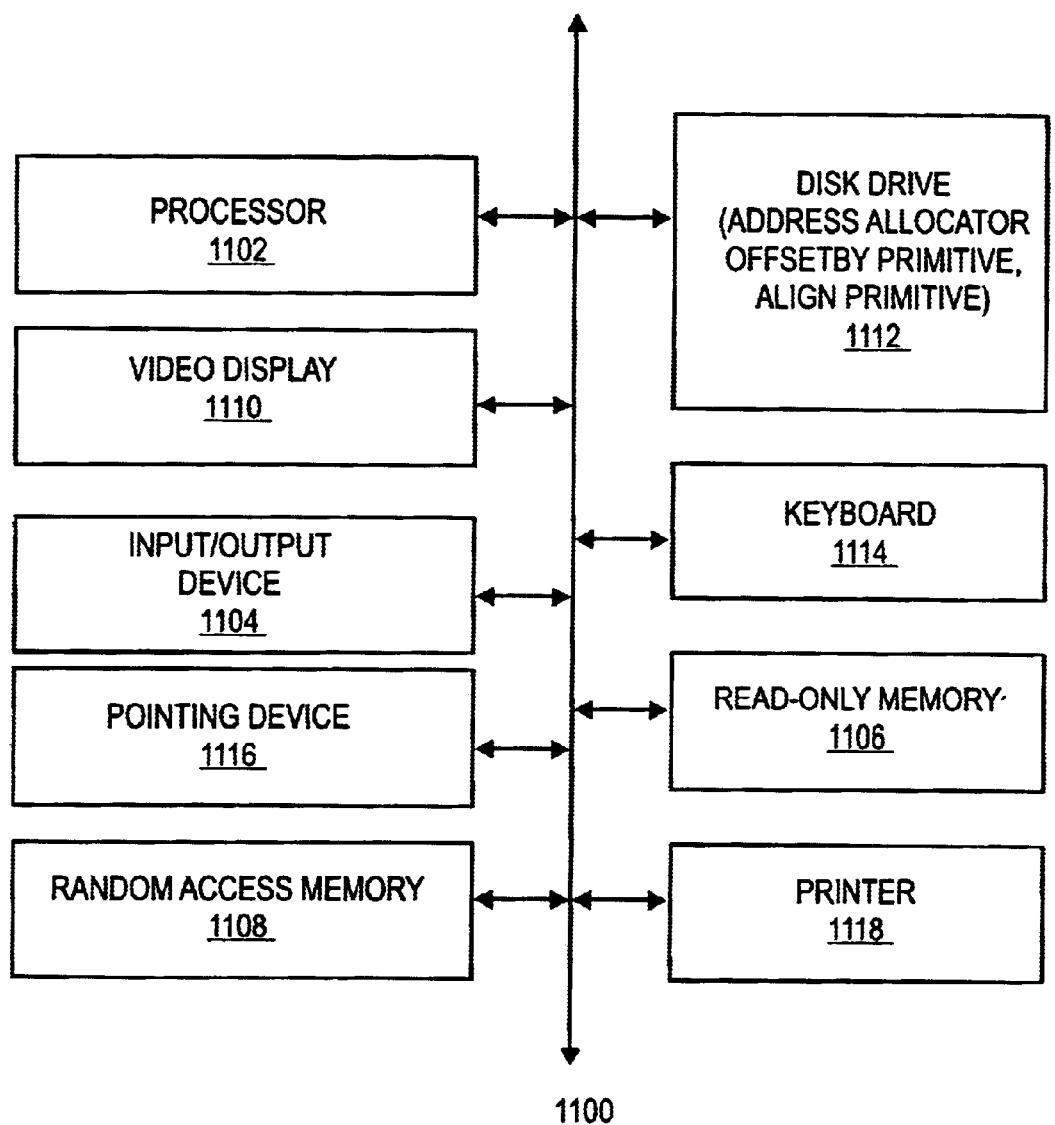
FIG. 11 illustrates an embodiment of a computer system that can be used with the present invention.

FIG. 11 illustrates an embodiment of a computer system that can be used with the present invention. The various components shown in FIG. 11 are provided by way of example. Certain components of the computer in FIG. 11 can be deleted from the addressing system for a particular implementation of the invention. The computer shown in FIG. 11 may be any type of computer including a general-purpose computer.

FIG. 11 illustrates a system bus 1100 to which various components are coupled. A processor 1102 performs the processing tasks required by the computer. Processor 1102 may be any type of processing device capable of implementing the steps necessary to perform the methods discussed above. An input/output (I/O) device 1104 is coupled to bus 1100 and provides a mechanism for communicating with other devices coupled to the computer. A read-only memory (ROM) 1106 and a random access memory (RAM) 1108 are coupled to bus 1100 and provide a storage mechanism for various data and information used by the computer. Although ROM 1106 and RAM 1108 are shown coupled to bus 1100, in alternate embodiments, ROM 1106 and RAM 1108 are coupled directly to processor 1102 or coupled to a dedicated memory bus (not shown).

A video display 1110 is coupled to bus 1100 and displays various information and data to the user of the computer. A disk drive 1112 is coupled to bus 1100 and provides for the long-term mass storage of information. Disk drive 1112 may be used to store various software programs including the data access technology mapper program and the address allocator program. Disk drive 1112 may also store the data access primitives (e.g., HALFSEL and BYTESEL), the primitives (e.g., OFFSETBY, ALIGN) and the source HDL programs used by the logic designer to model the circuit. Disk drive 1112 may also store a synthesis program. A keyboard 1114 and pointing device 1116 are also coupled to bus 1100 and provide mechanisms for entering information and commands to the computer. A printer 1118 is coupled to bus 1100 and is capable of creating a hard-copy of information generated by or used by the computer.

Figure 12:
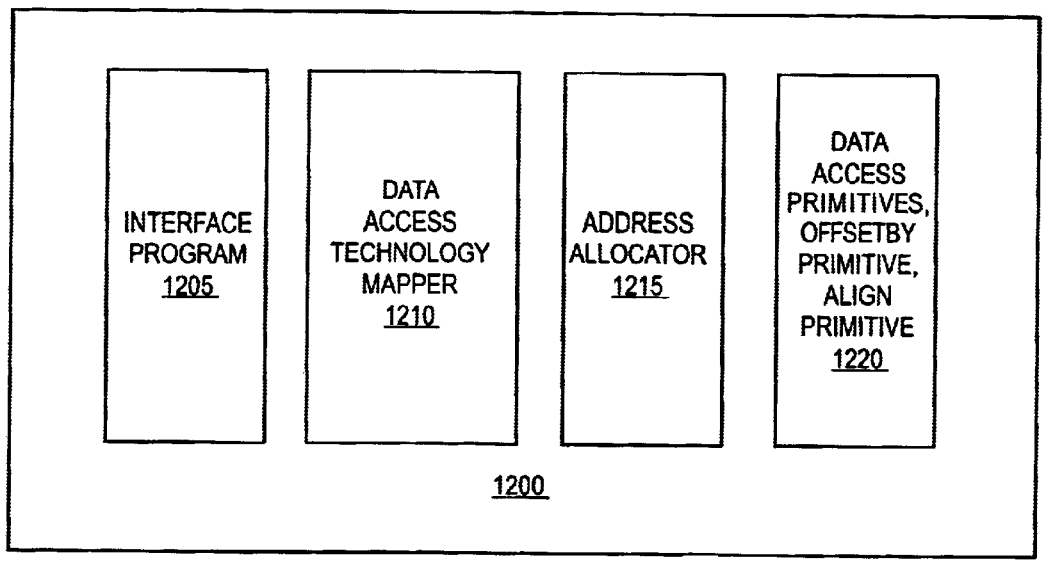
FIG. 12 illustrates an embodiment of a computer-readable medium.

FIG. 12 illustrates an embodiment of a computer-readable medium 1200 containing various sets of instructions, code sequences, configuration information, and other data used by a computer or other processing device. The various information stored on medium 1200 is used to perform various data processing operations. Computer-readable medium 1200 is also referred to as a processor-readable medium. Computer-readable medium 1200 can be any type of magnetic, optical, or electrical storage medium including a diskette, magnetic tape, CD-ROM, memory device, or other storage medium.

Computer-readable medium 1200 includes interface code 1205 that controls the flow of information between various devices or components in the computer system. Interface code 1205 may control the transfer of information within a device (e.g., between the processor and a memory device), or between an input/output port and a storage device. Additionally, interface code 1205 may control the transfer of information from one device to another. Computer-readable medium 1200 may also includes the data access techlology mapper program 1210, the address allocator program 1215, the data access primitives, and the ALIGN and OFFSET primitive 1220.

Thus, using the method disclosed, the logic designer can leave the address of a memory-mapped device unspecified, allowing the address allocator and data access technology mapper to decide the details of address-matching, lane-matching, and bus connectivity. The logic designer can change the addresses assigned to memory-mapped logic devices without changing the logic design.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A method, comprising:
   using an align primitive in a logic design to assert an address alignment for a memory-mapped device, the align primitive comprising an alignment size port, an input address port and an output address port, the alignment size port having a data value indicating a desired address boundary, the input address port used for an address to be verified against the desired address boundary, and the output address port used to provide an address being on the desired address boundary; and
   providing the address to be verified against the desired address boundary at the output address port when that address satisfies the desired address boundary specified at the alignment size port.

2. The method of claim 1, further comprising generating an address violation when the address to be verified against the desired address boundary fails to satisfy the desired address boundary.

3. The method of claim 1, wherein the address to be verified against the desired address boundary is specified by a logic designer.

4. The method of claim 3, wherein the address to be verified against the desired address boundary is a multiple of the data value at the alignment size port.

5. The method of claim 4, wherein the address to be verified against the desired address boundary is specified by an address allocator when the address is not specified by the logic designer.

6. The method of claim 1, wherein two or more align primitives are used in series to assert the address alignment for the memory-mapped device.

7. The method of claim 6, wherein an alignment size data value of one align primitive is not greater than an alignment size data value of any previous align primitives.

8. A computer readable medium containing executable instructions which, when executed in a processing system, causes the processing system to perform the steps of a method comprising:
   using an align primitive in a logic design to assert an address alignment for a memory-mapped device, the align primitive comprising an alignment size port, an input address port and an output address port, the alignment size port having a data value indicating a desired address boundary, the input address port used for an address to be verified against the desired address boundary, and the output address port used to provide an address being on the desired address boundary; and
   providing the address to be verified against the desired address boundary at the output address port when that address satisfies the desired address boundary specified at the alignment size port.

9. The computer readable medium of claim 8, further comprising generating an address violation when the address to be verified against the desired address boundary fails to satisfy the desired address boundary.

10. The computer readable medium of claim 8, wherein the address to be verified against the desired address boundary is specified by a logic designer.

11. The computer readable medium of claim 10, wherein the address to be verified against the desired address boundary is a multiple of the data value at the alignment size port.

12. The computer readable medium of claim 11, wherein the address to be verified against the desired address boundary is specified by an address allocator when the address is not specified by the logic designer.

13. The computer readable medium of claim 8, wherein two or more align primitives are used in series to assert the address alignment for the memory-mapped device.

14. The computer readable medium of claim 13, wherein an alignment size data value of one align primitive is not greater than an alignment size data value of any previous align primitives.

15. A method, comprising:
   specifying a data value representing a desired address boundary for a starting address for a data access primitive, the data access primitive indicating an addressing matching logic, a lane matching logic and one or more bus connections for a memory-mapped device; and
   generating the starting address for the data access primitive, the starting address meeting the desired address boundary.

16. The method of claim 15, further comprising asserting the starting address for the data access primitive.

17. The method of claim 16, wherein the starting address for the data access primitive is a multiple of the data value representing the desired address boundary.

18. The method of claim 15, further comprising instantiating the address matching logic, the lane matching logic and the one or more bus connections for the memory-mapped device using the starting address and an access transaction size of the memory-mapped device.

19. The method of claim 15, wherein generating the starting address comprises specifying an address constraint for the memory-mapped device.

20. The method of claim 19, wherein the starting address is generated automatically by an address allocator using the address constraint and the desired address boundary.

21. A computer readable medium containing executable instructions which, when executed in a processing system, causes the processing system to perform the steps of a method comprising:
   specifying a data value representing a desired address boundary for a starting address for a data access primitive, the data access primitive indicating an addressing matching logic, a lane matching logic and one or more bus connections for a memory-mapped device; and
   generating the starting address for the data access primitive, the starting address meeting the desired address boundary.

22. The computer readable medium of claim 21, further comprising asserting the starting address for the data access primitive.

23. The computer readable medium of claim 21, wherein the starting address for the data access primitive is a multiple of the data value representing the desired address boundary.

24. The computer readable medium of claim 21, further comprising instantiating the address matching logic, the lane matching logic and the one or more bus connections for the memory-mapped device using the starting address and an access transaction size of the memory-mapped device.

25. The computer readable medium of claim 21, wherein generating the starting address comprises specifying an address constraint for the memory-mapped device.

26. The computer readable medium of claim 25, wherein the starting address is generated automatically by an address allocator using the address constraint and the desired address boundary.

27. A method, comprising:

using one or more offset primitives in a logic design to assert an address for a memory-mapped device, wherein each of the one or more offset primitives comprising an incoming address port, an outgoing address port and an offset value port, the offset value port having a data value indicating a desired address offset, the incoming address port having a base address to calculate an offset address, and the outgoing address port having the offset address, wherein a sum of the offset values of the one or more offset primitives is a multiple of a transaction size at the memory-mapped device.

28. The method of claim 27, wherein the base address at the incoming port is specified by a logic designer.

29. The method of claim 27, wherein the base address at the incoming port is specified by an address allocator when it is not specified by a logic designer.

30. The method of claim 27, wherein an addition of the base address and the data value indicating the desired address offset is performed to calculate the offset address.

31. The method of claim 30, wherein any overflow of the addition is discarded.

32. The method of claim 31, wherein the data value indicating the desired address offset is non-negative.

33. A computer readable medium containing executable instructions which, when executed in a processing system, causes the processing system to perform the steps of a method comprising:

using one or more offset primitives in a logic design to assert an address for a memory-mapped device, wherein each of the one or more offset primitives comprising an incoming address port, an outgoing address port and an offset value port, the offset value port having a data value indicating a desired address offset, the incoming address port having a base address to calculate an offset address, and the outgoing address port having the offset address, wherein a sum of the offset values of the one or more offset primitives is a multiple of a transaction size at the memory-mapped device.

34. The computer readable medium of claim 33, wherein the base address at the incoming port is specified by a logic designer.

35. The computer readable medium of claim 33, wherein the base address at the incoming port is specified by an address allocator when it is not specified by a logic designer.

36. The computer readable medium of claim 33, wherein an addition of the base address and the data value indicating the desired address offset is performed to calculate the offset address.

37. The computer readable medium of claim 36, wherein any overflow of the addition is discarded.

38. The computer readable medium of claim 37, wherein the data value indicating the desired address offset is non-negative.

* * * * *